(12) United States Patent
Fisk et al.

(10) Patent No.: US 6,404,641 B1
(45) Date of Patent: Jun. 11, 2002

(54) TOOL-LESS QUICK RELEASE LATCHING MECHANISM FOR USE WITH A CARRIER AND A COMPARTMENT OF AN ENCLOSURE

(75) Inventors: Richard Fisk, Granada Hills, CA (US); William McDonough, McMinnville, OR (US)

(73) Assignee: Josef Rabinovitz, Chatsworth, CA (US)

( * ) Notice: Subject to any disclaimer, the term of this patent is extended or adjusted under 35 U.S.C. 154(b) by 0 days.

(21) Appl. No.: 09/419,026

(22) Filed: Oct. 15, 1999

(51) Int. Cl.[7] ................................................. G06F 1/16
(52) U.S. Cl. ...................... 361/727; 361/683; 312/332.1
(58) Field of Search ..................... 211/26; 361/683–687, 361/724–727; 312/332.1

(56) References Cited

U.S. PATENT DOCUMENTS 5,333,097 A * 7/1994 Christensen et al. ........ 361/685

* cited by examiner

Primary Examiner—Darren Schuberg
Assistant Examiner—Yean-Hsi Chang
(74) Attorney, Agent, or Firm—W. Edward Johnson

(57) ABSTRACT

A quick release latching mechanism is used with a combined carrier and a compartment of an enclosure. The quick release-latching mechanism securely couples the carrier and the device to a base. The quick release-latching device includes a mounting pin and a lever arm that the mounting pin pivotally mounts to one of the two side-walls of the base. The lever arm has a cut-portion in the shape of a short, rounded trough having a peripheral edge and, when pivotally mounted to the base, is disposed on the inside of the base on one of the two side-walls of the base so that, when the guide pins of the carrier have slid down the ramps of the cut-out portions of the two side-walls of the base and into the guide slots thereof, the peripheral edge of the cut-out portion of the lever arm entraps one of the guide pins of the carrier thereby securing the carrier and the device in place. The placement of the cover locks the quick release latching mechanism in place.

1 Claim, 3 Drawing Sheets

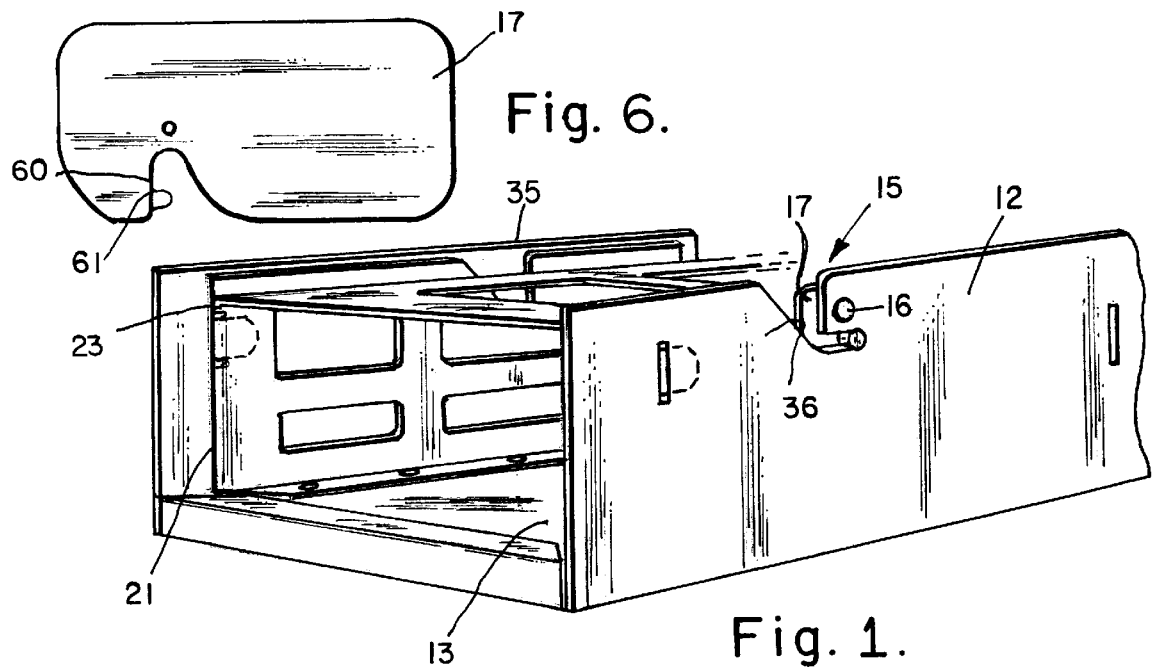
Fig. 6.
Fig. 1.
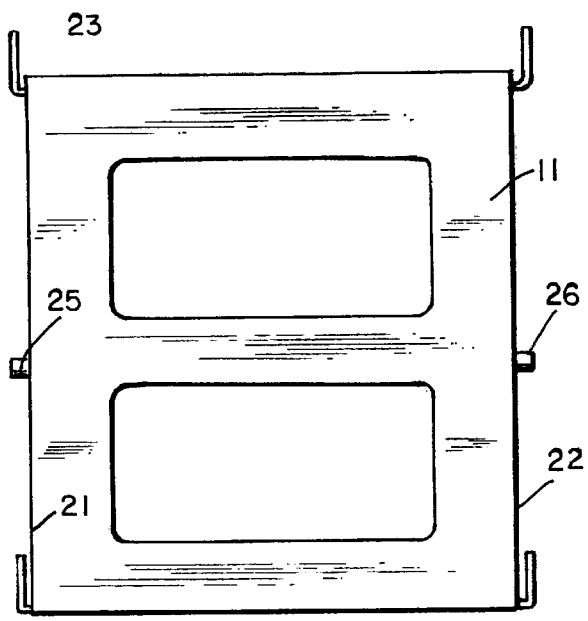
Fig. 2.
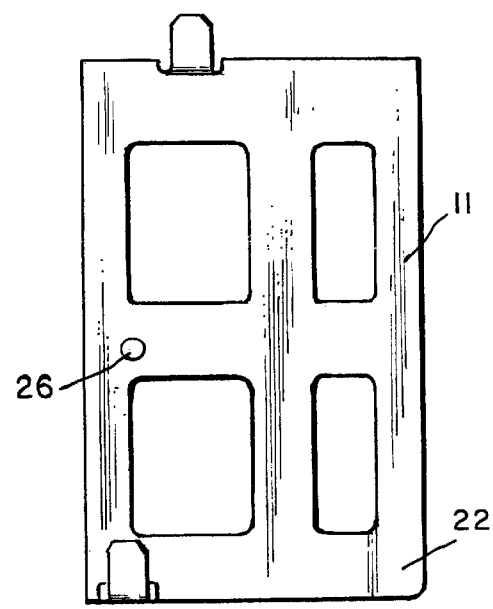
Fig. 3.

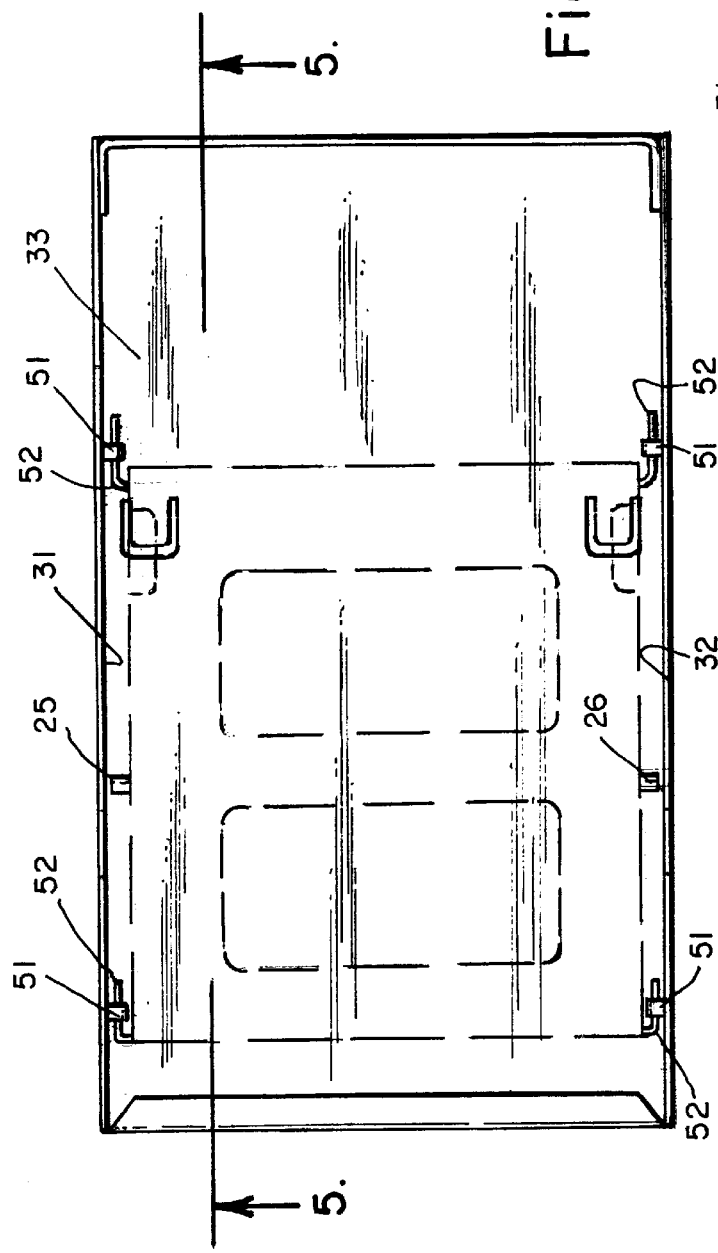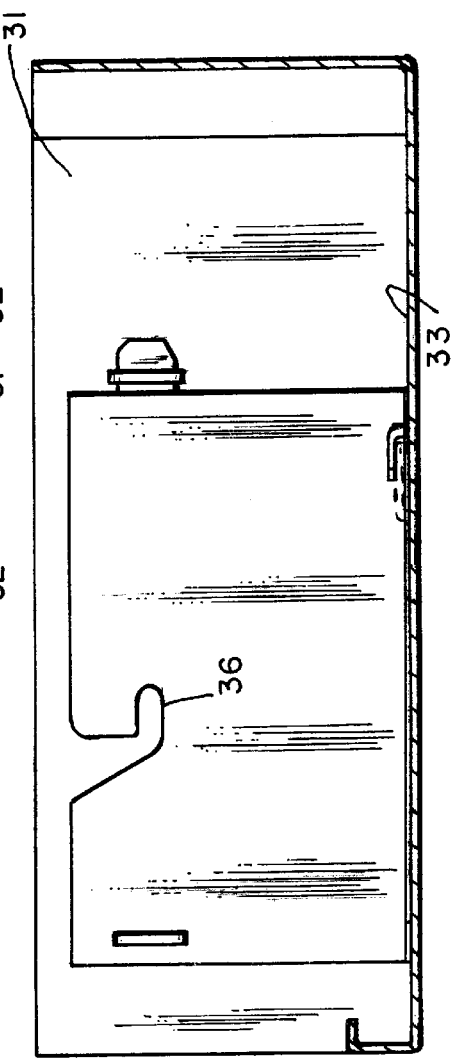

TOOL-LESS QUICK RELEASE LATCHING MECHANISM FOR USE WITH A CARRIER AND A COMPARTMENT OF AN ENCLOSURE

BACKGROUND OF THE INVENTION

The field of the invention is a carrier in portable removable engagement with a base of a compartment of an enclosure and more particularly a quick release latching mechanism for securing the carrier to the base.

U.S. Pat. No. 5,717,570 teaches a computer enclosure which has a drive bay for multiple hard disk drives implemented in the rear panel rather than in the front as is conventional, providing sufficient storage capacity for use as a file server in a mini-tower architecture. The side panels are designed for quick removal by moving a panel against a spring element for release. A security door with a lock controls access to the drive bay in the rear panel is controlled. The security screws for the removable side panels are located behind the security door. A fan bracket is provided allowing a single fan to be located in different positions or for multiple fans to be used. Fans may be easily added or replaced without powering down the computer, and provision is made in the fan bracket for mounting a speaker for the system.

U.S. Pat. No. 5,327,308 teaches a computer system providing for quick removal and quick and simple installation of a disk drive unit into the system. A latching and positioning arrangement provides releasable support for the disk drive unit and achieves automatic electric connections with the installation of the disk drive unit in the computer system.

U.S. Pat. No. 5,602,696 teaches a computer system providing for quick removal and quick and simple installation of a disk drive into the system. A latching and positioning arrangement provides releasable support for the disk drive unit and achieves automatic electric connections with the installation of the disk drive unit in the computer system.

U.S. Pat. No. 4,479,198 teaches each electronically operated customer installable/replaceable unit module of a computer system is separately packaged to totally enclose the electronic/mechanical parts of each module within a box-like container or wrapper, the structure designed to maximize air flow through the system. This includes an electronics base module containing the basic logic circuits for the system, a power module containing all of the systems power supply circuits, and a pair of storage modules each containing the electronics and mechanical parts of a diskette device. The modules are loosely inserted into comparably shaped opened compartments of an enclosure base and bezel assembly constructed for tool-less installation and removal of modules. A top cover of the enclosure fits into the bezel contains finger-like protrusions in addition to embossing. When latched to the base and bezel assembly, the top cover correctly positions and holds the modules in place.

U.S. Pat. No. 5,761,030 teaches an enhanced accessibility router which includes an outer housing with a side wall opening through which a support tray may be inserted into the housing interior and removed therefrom. A variety of printed circuit-boards, including a system input/output board, a CPU card, and various option cards are mounted on the tray for movement therewith. At the back end of the support tray is a specially designed latch and card support member which functions to releasably hold the tray in an outwardly withdrawn position thereof and to receive and support edge portions of the CPU card and option cards. The CPU card is captively retained on the tray by an elongated card retaining member that may be quickly and easily installed on and removed from the tray without tools. A front housing wall has an opening disposed therein and facing a PCMCIA card support structure mounted on the inner end of the support tray. When the tray is fully inserted into the housing interior the PCMCIA card support structure enters the front housing wall opening and is positioned to receive a PCMCIA card inserted rearwardly therethrough. Accordingly, access to the PCMCIA card support structure is provided through the front side of the housing when the tray is fully inserted, and from the rear side of the housing when the tray is pulled outwardly from the housing.

U.S. Pat. No. 5,485,348 teaches a computer floppy drive mounting assembly which is made to be slidably removable from a slide casing assembly which is located proximately to an open slot on the front of the computer without the use of any by allowing the drive mounting assembly to have a slotted portion near the front which fits over the edge of the open slot to hold the floppy drive in the computer and which when lifted over the edge allows easy removal of the floppy drive to provide easy access to the computer fuses inside the computer to allow them to be serviced and or replaced by the computer operator.

U.S. Pat. No. 5,683,156 teaches a computer housing which includes a frame body having a receiving frame for holding with a data read/write device, a front board provided with a first floating fastening element and a second floating fastening element provided on the data read/write device such that the second floating fastening element can be moved to engage with the first floating fastening element of the front board so as to enable the front board to be fastened securely with the frame body. A computer housing has a plurality of floating retainers to facilitate the speedy assembly of the computer, and thereby, the improved computer housing which can be joined with the front board securely without the use of fastening screws.

U.S. Pat. No. 5,927,389 teaches a computer housing which includes a compartment that provides space for mounting a fan assembly or similar component. The fan assembly is mounted on a fan tray support, which is removably mountable within the computer housing by means of the fan tray mounts. Fan tray mounts are oriented facing one another so that side-rails of fan tray are slidably received by the fan tray mounts. The fan tray mounts further includes an elongated guide channel that extends the length of the fan tray mount and is formed in the inside face thereof. The fan tray mounts also include a first, outwardly projecting stop that is positioned inwardly from end wall and a second, outwardly-projecting, resiliently-deflectable stop and latch lever provided adjacent end wall. The first stop and the second stop and latch cooperate with tabs on the fan tray to releasably latch the fan tray in a predetermined position along the guide channel. The fan tray mounts further include a pair of cantilevered spring arms, which bias the fan tray in a direction away from the guide channel to minimize vibration transmission to the computer housing.

U.S. Pat. No. 5,924,900 teaches a contact which includes at least one latching arm extending rearwardly from a forward end of a socket contact section to define a rearwardly facing latching surface at a free end thereof, for retention of the contact in a housing passageway. A single latching arm may be oriented edgewise with respect to the contact-receiving channel and be deflected laterally during insertion, or a pair of such latching arms coextend rearwardly for free ends thereof to be deflected toward each other during insertion. A single latching arm may be oriented parallel to the bottom wall and extend to a free end having side portions bent up to be oriented edgewise and be deflected into the contact-receiving channel during insertion.

U.S. Pat. No. 5,822,184 teaches a modular data device assembly for a computer which has a housing that is designed to fit into a conventional, industry standard size expansion bay. Individual plug-in data storage devices such as hard disk drives or CD-ROM drives are disposed vertically in a stacked formation within the housing. A motherboard with plug-in connectors to which the drives are connected allows easy replacement of defective data devices, which devices slide in or out. The disk drives and modular data device assemblies may be arrayed in series or in parallel to a controller. By its modular structure and redundant storage functions, the device benefits from what is known as Redundant Array of Inexpensive Disk principle.

U.S. Pat. No. 5,797,667 teaches a hard disk case mounting structure which includes an auxiliary stop bar provided at either side of a front end of a hard disk frame for preventing a pull handle on a case of the hard disk frame from being forcefully pulled up, thereby protecting the hard disk lock. Besides, the relative movement between the pull handle and the auxiliary stop bar may result in a counter force between the case and a mounting frame to cause two connecting ports to be separated to permit smooth removal of the hard disk.

U.S. Pat. No. 5,828,548 teaches a removable hard disk drive mounting arrangement which includes structures at the end of a rack that cooperate with structures on the shaft of a pivotal handle to ensure that final insertion of the hard disk drive casing into the rack is carried out in an even manner without excessive force. The mounting arrangement includes two notches at the end of a pivotal shaft of a handle for the casing and corresponding angles and bent portions of the rack which permit final insertion of the hard disk driving casing into the rack only when the handle is turned from a horizontal to a vertical position.

U.S. Pat. No. 5,886,869 teaches a sleeve for holding a hard disk drive in portable removable engagement with a computer enclosure which includes a base and a cover attachable to the base by mechanism of threaded fasteners. The base includes plural holder arms and when the cover is removed from the base and the hard disk drive advanced into the base, the holder arms move outwardly as the hard drive rides on the arms. When the hard disk drive clears the arms, the arms, which are biased to a hold configuration, move back inwardly to hold the hard disk drive in the base, with the cover then attached to the base. The edge of the cover cooperates with the base to hold the holder arms in the hold configuration and thereby securely hold the hard disk drive in the sleeve.

The inventor hereby incorporates all of the above referenced patents into this specification.

SUMMARY OF INVENTION

The present invention is generally directed to a carrier in portable removable engagement with a compartment of an enclosure. The carrier is u-shaped and has two side-walls, a top wall, no front wall, no rear wall and no bottom wall. The carrier holds a device. The compartment includes a base and a cover. The base is unshaped and has two side-walls, a bottom wall, no front wall, no rear wall and no top wall. The carrier and the device are disposed in the base. The cover disengageably attaches to the unshaped base to form the compartment. The carrier, the device and the compartment fit inside the enclosure.

In a first separate aspect of the present invention, each side-wall of the carrier has a guide pin. Each side-wall of the base has a cut-out portion in the shape of a ramp in series with a guide slot. The guide pin of each side-wall of the carrier is disposed so that the guide pin slidably aligns itself with the cut-out portion of one of the side-walls of the base.

In a second separate aspect of the present invention, a quick release latching mechanism securely couples the carrier and the device to the base and includes a mounting pin and a lever arm which the mounting pin pivotally mounts to one of the side-walls of the base. The lever arm has a cut-portion in the shape of a short, rounded trough having a peripheral edge and, when pivotally mounted to the base, is disposed on the inside of the base on one of the side-walls of the base so that, when the guide pins of the carrier have slided down the ramps of the cut-out portions of the side-walls of the base and into the guide slot thereof, the peripheral edge of the cut-out portion of the lever arm entraps one of the guide pins of the carrier thereby securing the carrier and the device in place. No tool is required to operate the quick release latching mechanism.

In a third separate aspect of the present invention, the placement of the cover locks the quick release latching mechanism in place.

In a fourth separate aspect of the present invention, the device may be a hard disk drive, a compact disk drive, a tape drive, any other memory device or any other computer device.

In a fifth separate aspect of the present invention, the unshaped base has a plurality of guide slots and the carrier has a plurality of guide protrusions which are disposed thereon so that each guide protrusion is in slidable alignment with one of the guide slots.

Other aspects and many of the attendant advantages will be more readily appreciated as the same becomes better understood by reference to the following detailed description.

The features of the present invention which are believed to be novel are set forth with particularity in the appended claims.

DESCRIPTION OF DRAWINGS

FIG. 1 is a partial perspective view of an enclosure which includes a carrier, a base of a compartment and a quick release latching mechanism according to the present invention.

FIG. 2 is a top plan view of the carrier of FIG. 1.

FIG. 3 is a side elevational view of the carrier of FIG. 1.

FIG. 4 is a top plan view of the base of the compartment of FIG. 1.

FIG. 5 is a side elevational view in cross-section of the base of the compartment of FIG. 1 taken along the line 5—5 of FIG. 4.

FIG. 6 is a top plan view of a lever arm of the quick release latching mechanism of FIG. 1.

DESCRIPTION OF THE PREFERRED EMBODIMENT

Figure 7:
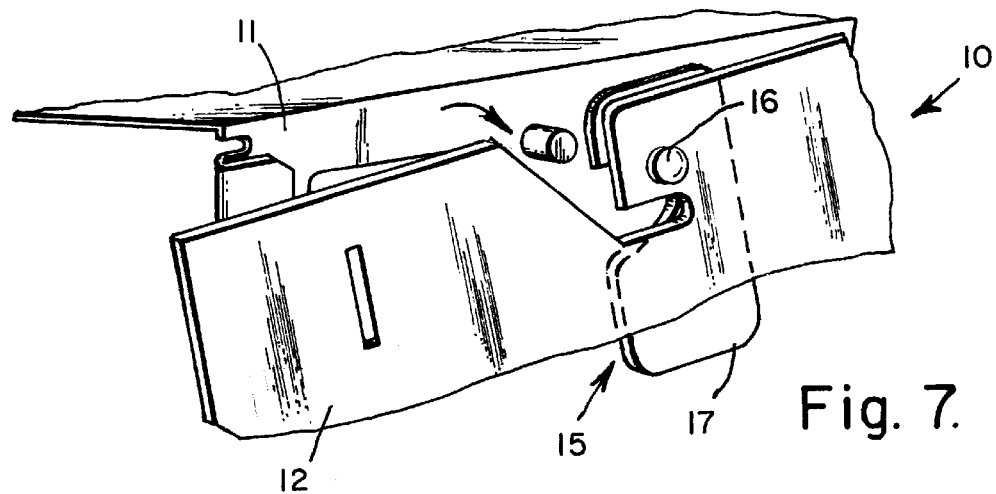
FIG. 7 is a partial perspective of the carrier having a pair of guide pins, the base of a compartment having a pair of cut-out portion in the shape of a ramp in series with a guide-slot and the quick release latching mechanism of FIG. 1 as the carrier is being inserted into the case of the compartment.

Referring to FIG. 1 an enclosure 10 has a carrier 11 and a compartment 12 which includes a base 13. The carrier 11 is in removable engagement with the base 13 of the compartment 12. The carrier 11 hold a device, such as a hard disk drive. The carrier 11, the device and the base 13 of the compartment 12 are disposed in the enclosure 10. A quick release latching mechanism 15 securely couples the carrier 11 and the device to the base 13. The quick release latching mechanism 15 includes a mounting pin 16 and a lever arm 17. Referring to FIG. 2 in conjunction with FIG. 1 and FIG. 3 in a first embodiment the carrier 11 is unshaped and has a first side-wall 21, a second side-wall 22, a top wall 23, no rear wall, no front wall and no bottom wall. The first and second side-walls 21 and 22 of the carrier has a first guide pin 25 and a second guide pin 26, respectively. The carrier 11 contributes to the structure of the enclosure 10 making it more rigid thereby permiting use of thinner walls. In a second embodiment a carrier may be u-shaped and may have a first side-wall, a second side-wall, a bottom wall, no rear wall, no front wall and no top wall.

Referring to FIG. 4 in conjunction with FIG. 1 the base 13 is unshaped and has a first side-wall 31, a second side-wall 32, a bottom wall 33, no front wall, no rear wall and no top wall. The mounting pin 16 pivotally mounts the lever arm 17 to one of the first and second side-walls 31 and 32 of the base 13. The carrier 11 and the device may be disposed in the base 30. The first and second side-walls 31 and 32 of the base 30 have a first cut-out portion 35 and a second cut-out portion 36, respectively. The first and second cut-portions 35 and 36 are in the shape of a ramp in series with a guide slot. The first and second guide pins 25 and 26 of the first and second side-walls 21 and 22 of the carrier 11 are disposed so that the first and second guide pins 25 and 26 slidably align themselves with the first and second cut-out portions 35 and 36 of the first and second side-walls 31 and 32 of the base 30, respectively.

Referring to FIG. 5 in conjunction with FIG. 1 and FIG. 4 the base 30 has a plurality of guide slots 51 and the carrier 11 has a plurality of guide protrusions 52. The guide protrusion 52 are disposed thereon so that each guide protrusion 52 is in slidable alignment with one of the guide slots 51 thereby providing additional rigidity to the combined carrier 11, device and base 30.

Referring to FIG. 6 in conjunction with FIG. 1 and FIG. 7 the lever arm 17 has a cut-portion 60 in the shape of a short, rounded trough having a peripheral edge 61 and, when pivotally mounted to the base 13, is disposed on the inside of the base 13 on one of the first and second side-walls 31 and 32 of the base 13 so that, when the guide pins 25 and 26 of the carrier 11 have slided down the ramps of the first and second cut-out portions 35 and 36 of the first and second side-walls 31 and 32 of the base 13 and into the guide slots thereof.

Figure 8:
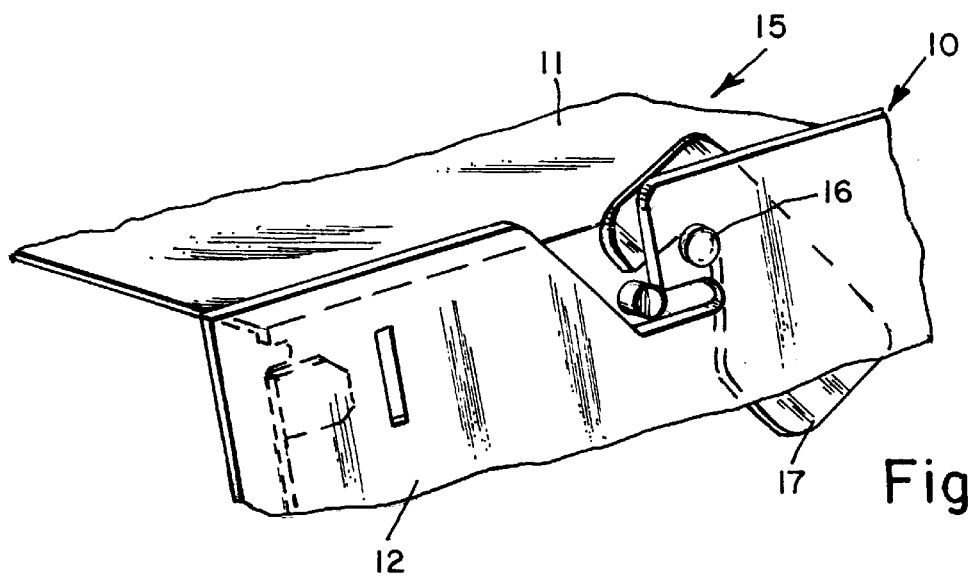
FIG. 8 is a partial perspective of the carrier, the base of a compartment and the quick release latching mechanism of FIG. 1 as the quick release latching mechanism is about to secure the carrier within the base of the compartment.

Referring to FIG. 6 in conjunction with FIG. 1 and FIG. 8 the peripheral edge 61 of the cut-out portion 60 of the lever arm 17 entraps one of the guide pins 25 and 26 of the carrier arm 11 thereby securing the carrier 11 and the device in place. A second lever arm 17 may be pivotally mounted to the other side-wall of the base 13 so that the latch will work on both sides of the enclosure 10 thereby doubling the effective forward holding force. No tool is required to operate the quick release latching mechanism 15.

Figure 9:
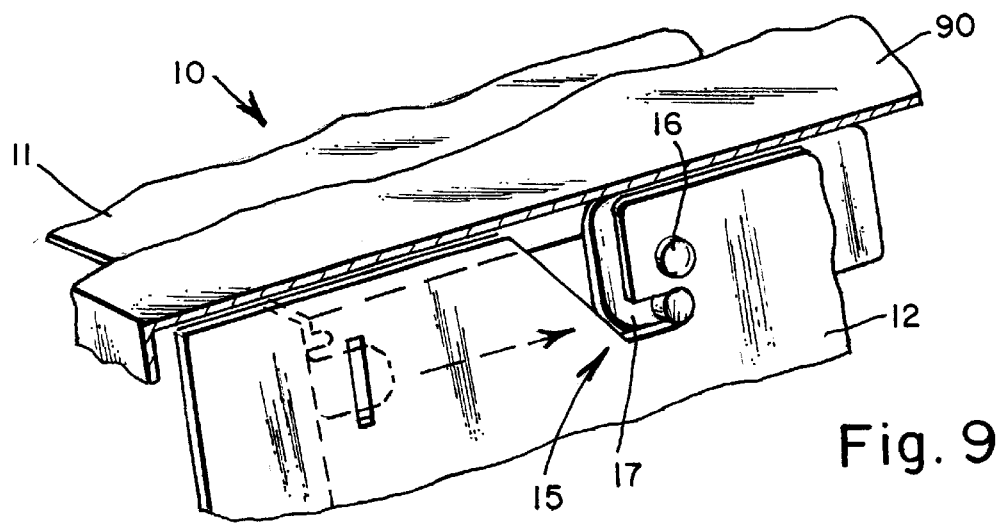
FIG. 9 is a partial perspective of the carrier, the base of a compartment and the quick release latching mechanism of FIG. 1 and a cover after the quick release latching mechanism has secured the carrier within the base of the compartment and the placement of the cover locks the quick release latching mechanism in place.

Referring to FIG. 6 in conjunction with FIG. 1 and FIG. 9 the compartment 12 also includes a cover 90. The cover 90 disengageably attaches to the base 13 in order to enclose the compartment. The carrier 11, the device and the compartment 12 fit inside the enclosure 10. Pushing the carrier back after being engaged in slot causes latch to automatically roatate.

From the foregoing it can be seen that an enclosure which includes a carrier, a base of a compartment and a quick release latching mechanism has been described.

Accordingly it is intended that the foregoing disclosure be considered only as an illustration of the principle of the present invention.

What is claimed is:

1. A combined carrier, a compartment of an enclosure and a quick release comprising:

a carrier being u-shaped and having two side-walls and a top wall wherein each of said two side-walls has a guide pin and wherein said carrier holds a device;

a compartment including a base and a cover wherein said base is u-shaped and has two side-walls and a bottom wall and wherein said carrier and the device are disposed in the base with said cover being disengageably attached to said base to form the compartment whereby each of said two side-walls of said base has a cut-out portion in the shape of a ramp in series with a guide slot whereby said guide pin of each of said two side-walls of said carrier is disposed so that said guide pins slidably aligns themselves with the cut-out portion of one of said two side-walls of said base;

a quick release latching mechanism for securely coupling said carrier and the device to said base wherein said quick release latching mechanism includes a mounting pin and a lever arm which said mounting pin pivotally mounts to one of said two side-walls of said base and wherein said lever arm has a cut-portion in the shape of a short, rounded trough having a peripheral edge and, when pivotally mounted to said base, is disposed on the inside of said base on one of said two side-walls of said base so that, when said guide pins of said carrier have slided down the ramps of said cut-out portions of said two side-walls of said base and into said guide slots thereof, said peripheral edge of said cut-out portion of said lever arm entraps one of said guide pins of said carrier thereby securing said carrier and the device in place whereby the placement of said cover locks said quick release latching mechanism in place.

* * * * *